(12) United States Patent
Lian et al.

(10) Patent No.: US 8,256,500 B2
(45) Date of Patent: Sep. 4, 2012

(54) HEAT DISSIPATION DEVICE HAVING SUPPORT BRACKETS WITH BUCKLES TO SUPPORT THE FAN

(75) Inventors: Zhi-Sheng Lian, Shenzhen (CN); Gen-Ping Deng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 436 days.

(21) Appl. No.: 12/581,175

(22) Filed: Oct. 19, 2009

(65) Prior Publication Data

US 2011/0048678 A1   Mar. 3, 2011

(30) Foreign Application Priority Data

Aug. 27, 2009   (CN) .......................... 2009 1 0306145

(51) Int. Cl.
*F28F 7/00* (2006.01)

(52) U.S. Cl. ........ 165/80.3; 165/121; 361/697; 361/700
(58) Field of Classification Search ................ 165/80.3, 165/121, 104.33, 185; 361/697, 700
See application file for complete search history.

(56) References Cited

U.S. PATENT DOCUMENTS

| 5,495,392 | A | * | 2/1996 | Shen | 361/697 |
| 5,854,738 | A | * | 12/1998 | Bowler | 361/695 |
| 2003/0136546 | A1 | * | 7/2003 | Zhang | 165/80.3 |
| 2004/0000398 | A1 | * | 1/2004 | Lee et al. | 165/185 |
| 2005/0126762 | A1 | * | 6/2005 | Lin | 165/104.33 |
| 2010/0246126 | A1 | * | 9/2010 | Chou et al. | 361/697 |

* cited by examiner

*Primary Examiner* — Cheryl J Tyler
*Assistant Examiner* — Orlando E Aviles Bosques
(74) *Attorney, Agent, or Firm* — Altis Law Group, Inc.

(57) ABSTRACT

A heat dissipation device includes a heat sink, a fan having a flange and a plurality of brackets mounting the fan on the heat sink. Each of the brackets includes two pair of spaced buckles extending from a top thereof toward the fan. A bottom of each bracket is fixed on a bottom of the heat sink. The two pair of buckles of the bracket are buckled on the flange of the fan.

11 Claims, 3 Drawing Sheets

HEAT DISSIPATION DEVICE HAVING SUPPORT BRACKETS WITH BUCKLES TO SUPPORT THE FAN

BACKGROUND

1. Technical Field

The disclosure relates to heat dissipation and, more particularly, to a heat dissipation device with a bracket capable of conveniently fastening a fan on or detaching the fan from a heat sink.

2. Description of Related Art

Nowadays, numerous heat dissipation devices are used to dissipate heat generated by electronic devices. Generally, a heat dissipation device comprises a heat sink and a fan. The fan is fastened on the heat sink via a plurality of screws. The fan needs to be disassembled from the heat sink for maintenance or replacing with another fan after the fan is used for a long time. In disassembly, since the fan is connected to the heat sink via the screws, a screwdriver is required to detach the screws from the heat sink. Thus, it is inconvenient to disassemble the fan from the heat sink.

What is needed, therefore, is a heat dissipation device which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
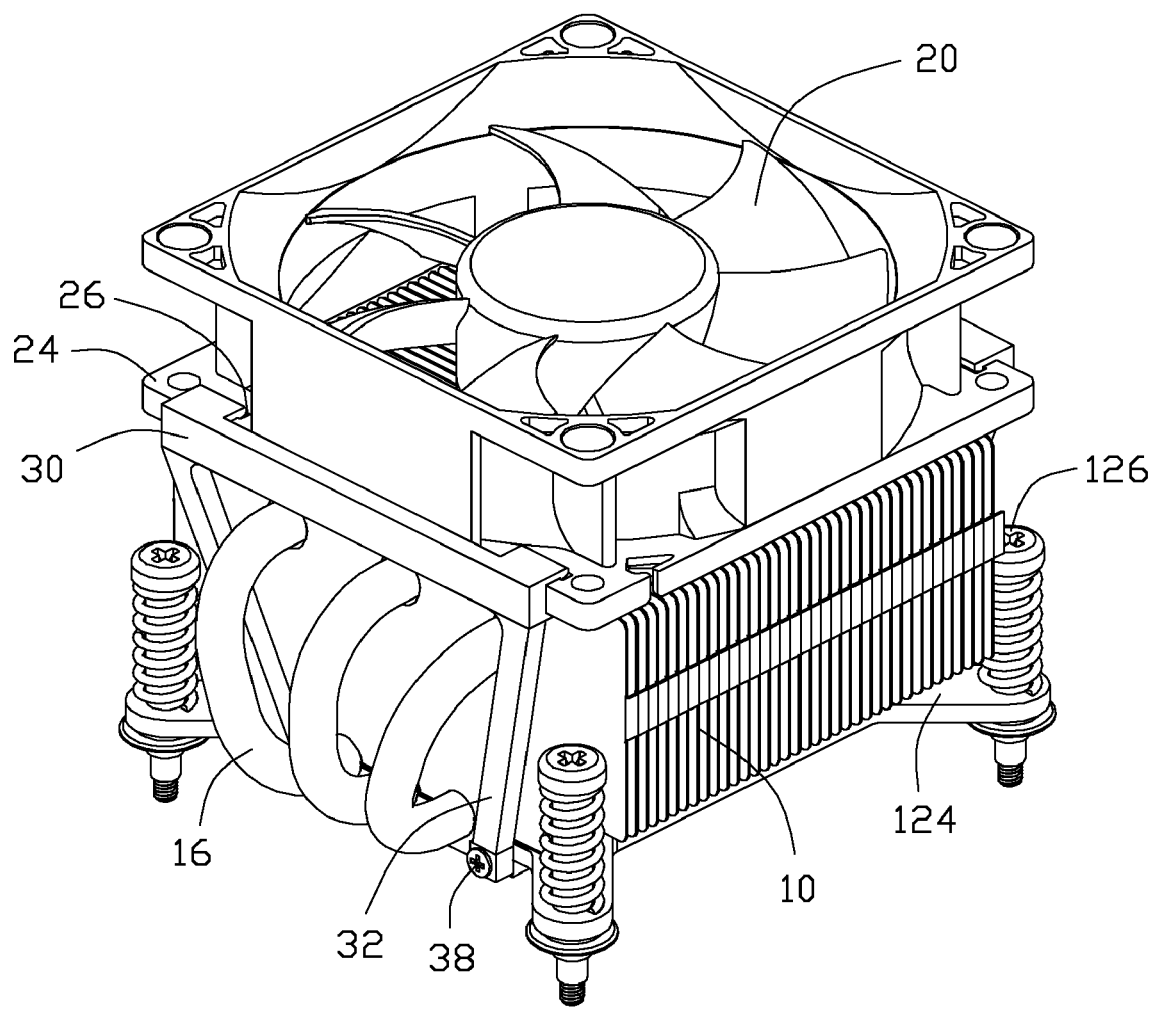
FIG. 1 is an isometric, assembled view of a heat dissipation device in accordance with one embodiment of the disclosure.

Referring to FIG. 1, a heat dissipation device in accordance with an embodiment of the disclosure comprises a heat sink 10, a fan 20, and two brackets 30 fastening the fan 20 on the heat sink 10.

Figure 2:
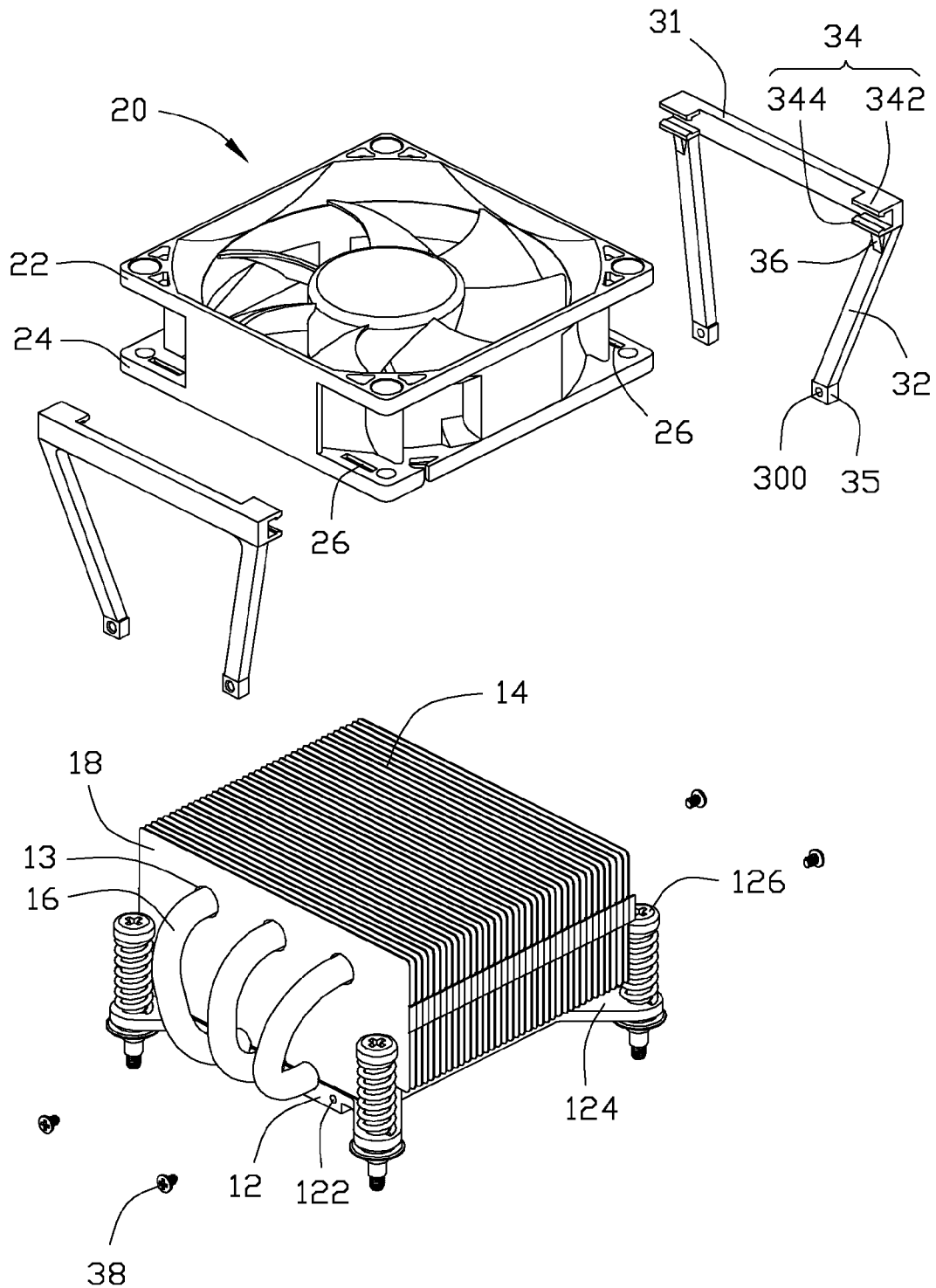
FIG. 2 is an isometric, exploded view of the heat dissipation device of FIG. 1.

Also referring to FIG. 2, the heat sink 10 includes a rectangular heat conducting plate 12, a fin assembly 14 disposed on the heat conducting plate 12 and three heat pipes 16 connecting the heat conducting plate 12 and the fin assembly 14. The fin assembly 14 includes a plurality of spaced, parallel fins 18 arranged closely together, and each fin 18 is integrally made of metal such as aluminum, copper or an alloy thereof. Three channels 13 are defined in a top of the fin assembly 14, and another three channels 13 are defined where a bottom of the fin assembly 14 abuts a top of the heat conducting plate 12. The three heat pipes 16 each with two ends are inserted into the channels 13. The heat conducting plate 12 is integrally made of metal such as aluminum, copper or an alloy thereof. Four ears 124 extend outwardly and horizontally from four corners of the heat conducting plate 12, and four fasteners 126 are mounted on the four ears 124. A front side and a rear side of the heat conducting plate 12 respectively define two threaded holes 122.

Figure 3:
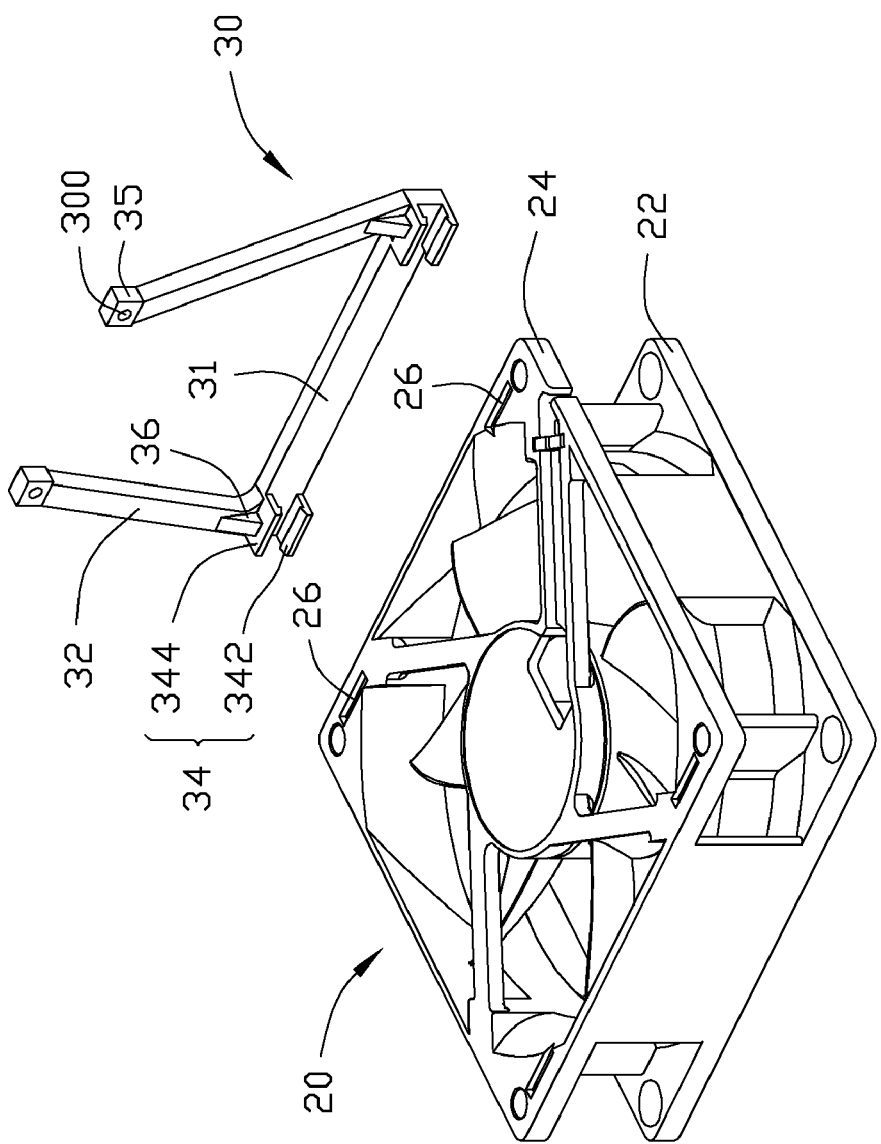
FIG. 3 is an inverted view of a fan and two brackets of the heat dissipation device of FIG. 2.

Also referring to FIG. 3, the fan 20 is generally rectangular in shape and includes an upper flange 22 and a lower flange 24 parallel to the upper flange 22. The lower flange 24 defines four slots 26 in a top and a bottom of four corners thereof. The slots 26 in each corner of the lower flange 24 communicate with each other. Understandably, the slots 26 in each corner can be blind slots and separated from each other in alternative embodiments.

Each bracket 30 is integrally formed of an elastic material such as plastic or rubber, and includes a beam 31 and two connecting shafts 32 downwardly and slantwise extending from two ends of the beam 31. An attaching portion 35 vertically and downwardly extends from a bottom, distal end of each connecting shaft 32. The attaching portion 35 defines a through hole 300 for a screw 38 to extend therethrough. Two pairs of spaced, opposite flexible buckles 34 extend from the two ends of the beam 31 toward the fan 20. Each buckle 34 comprises a flexible extending arm 342 extending from the beam 31 and a wedge-shaped retaining portion 344 extending from an inner side of a distal end of the extending arm 342. The retaining portions 344 in each pair of the buckles 34 face toward each other. A distance between two opposite extending arms 342 of each pair of the buckles 34 is slightly larger than a thickness of the lower flange 24 of the fan 20 so that the pair of the buckles 34 can be buckled on the lower flange 24 firmly. A strengthener 36 protrudes from a bottom of a bottom one of each pair of the buckles 34 and connects with the connecting shaft 32 to strengthen the bracket 30. The strengthener 36 generally has a right-angled triangular configuration.

In assembly, the two opposite extending arms 342 of each pair of the buckles 34 are forced by the lower flange 24 of the fan 20 to deform outwardly, until the retaining portions 344 of the buckles 34 are snappily received in the slots 26 of the lower flange 24, whereupon the extending arms 342 of the buckles 34 return to their original positions. The heat conducting plate 12, the fin assembly 14 and the heat pipes 16 of the heat sink 10 are thus assembled together. The fan 20 with the brackets 30 buckled thereon is placed on the heat sink 10 to make the through holes 300 of the brackets 30 align with the threaded holes 122 of the heat conducting plate 12 of the heat sink 10. Four screws 38 are extended through the through holes 300 of the brackets 30 and engaged into the threaded holes 122 of the heat conducting plate 12 of the heat sink 10 to mount the fan 20 on the heat sink 10. When detaching the fan 20 from the heat sink 10, the extending arms 342 of the buckles 34 of the brackets 30 are pulled outwardly to make the extending arms 342 deform outwardly relative to the lower flange 24 of the fan 20 and separate from the slots 26 of the lower flange 24. Thus, the fan 20 is detached from the heat sink 10.

According to the disclosure, since the fan 20 is mounted on the heat sink 10 via the buckles 34 of the brackets 30 buckled on the lower flange 24 of the fan 20, it is convenient to mount the fan 20 on the heat sink 10 or disassemble the fan 20 from the heat sink 10.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device, comprising:
   a heat sink;
   a fan; and a plurality of brackets mounting the fan on the heat sink, each of the brackets comprising two pairs of spaced, opposite flexible buckles extending from a top thereof toward the fan;

wherein a bottom of each of the brackets is fixed on a bottom of the heat sink;

wherein each of the brackets further comprises a beam and two connecting shafts downwardly extending from two ends of the beam, and the buckles extend from the two ends of the beam toward the fan;

wherein each of the buckles further comprises a flexible extending arm extending from the beam and a retaining portion extending from a distal end of the extending arm, the retaining portions in each pair of the buckles facing toward each other; and wherein the fan comprises an upper flange far from the brackets and a lower flange near the brackets, the lower flange defining a plurality of slots in top and bottom thereof, the lower flange being buckled between each pair of the buckles, the retaining portions of each pair of the buckles being respectively received into the slots in the top and bottom of the lower flange.

2. The heat dissipation device as claimed in claim 1, wherein the heat sink comprises a heat conducting plate and a fin assembly attached to the heat conducting plate, the fin assembly comprising a plurality of fins arranged together, the heat conducting plate defining a plurality of threaded holes, the bottom of each of the brackets defining a through hole corresponding to one of the threaded holes of the heat conducting plate, a plurality of screws extending through the through holes of the brackets and engaging in the threaded holes of the heat conducting plate.

3. The heat dissipation device as claimed in claim 2, wherein the heat sink comprises a plurality of heat pipes, a group of channels being defined in a top of the fin assembly, and another group of channels being defined where a bottom of the fin assembly abuts the heat conducting plate, the heat pipes each with two ends being inserted into the channels.

4. The heat dissipation device as claimed in claim 1, wherein each of the brackets is integrally formed of an elastic material.

5. The heat dissipation device as claimed in claim 1, wherein a strengthener protrudes from a bottom of a bottom one of each pair of the buckles and connects with the connecting shaft to strengthen the bracket.

6. A heat dissipation device, comprising:
a heat sink comprising a heat conducting plate and a fin assembly attached to the heat conducting plate;
a fan; and
a plurality of brackets mounting the fan on the heat sink, each of the brackets comprising two pairs of spaced, opposite flexible buckles extending from a top thereof toward the fan;

wherein a bottom of each of the brackets is fixed on the heat conducting plate of the heat sink;

wherein each of the brackets further comprises a beam and two connecting shafts downwardly extending from two ends of the beam, and the two pairs of spaced, opposite flexible buckles extend from the two ends of the beam toward the fan;

wherein each of the buckles further comprises a flexible extending arm extending from the beam and a retaining portion extending from a distal end of the extending arm, the retaining portions in each pair of the buckles facing toward each other; and wherein the fan comprises an upper flange far from the brackets and a lower flange near the brackets, the lower flange defining a plurality of slots in top and bottom thereof, the lower flange being buckled between each pair of the buckles, the retaining portions of each pair of the buckles being respectively received into the slots in the top and bottom of the lower flange.

7. The heat dissipation device as claimed in claim 6, wherein the fin assembly comprises a plurality of fins arranged together, the heat conducting plate defining a plurality of threaded holes, the bottom of each of the brackets defining a through hole corresponding to one of the threaded holes of the heat conducting plate, a plurality of screws extending through the through holes of the brackets and engaging in the threaded holes of the heat conducting plate.

8. The heat dissipation device as claimed in claim 7, wherein the heat sink further comprises a plurality of heat pipes, a group of channels being defined in a top of the fin assembly, and another group of channels being defined where a bottom of the fin assembly abuts the heat conducting plate, the heat pipes each with two ends being inserted into the channels.

9. The heat dissipation device as claimed in claim 6, wherein each of the brackets is integrally formed of an elastic material.

10. The heat dissipation device as claimed in claim 6, wherein a strengthener protrudes from a bottom of a bottom one of each pair of the buckles and connects with the connecting shaft to strengthen the bracket.

11. The heat dissipation device as claimed in claim 6, wherein the retaining portion is wedge-shaped.

* * * * *